United States Patent [19]

Lui

[11] Patent Number: 5,325,363
[45] Date of Patent: Jun. 28, 1994

[54] FAULT TOLERANT POWER SUPPLY FOR AN ARRAY OF STORAGE DEVICES

[75] Inventor: Albert S. Lui, San Jose, Calif.

[73] Assignee: Tandem Computers Incorporated, Cupertino, Calif.

[21] Appl. No.: 881,434

[22] Filed: May 11, 1992

[51] Int. Cl.$^5$ .................. G06F 1/30; G11B 33/12
[52] U.S. Cl. .................. 371/8.1; 395/575; 395/750
[58] Field of Search ............. 371/8.1, 10.1; 395/575, 395/750

[56] References Cited

U.S. PATENT DOCUMENTS 4,754,397  6/1988  Varaiya et al. ............ 364/200

OTHER PUBLICATIONS

Schulze, M., "Considerations in the Design of a Raid Prototype", Report No. UCB/CSD 88/448, Aug. 1988.
Info World; Jul. 6, 1992, p. 33, vol. 14, Issue 27, "Storage Solutions Deploys Line of SCSI-Based Disk Arrays", Scannell, E.

Primary Examiner—Stephen M. Baker
Attorney, Agent, or Firm—Graham & James

[57] ABSTRACT

A fault tolerant power supply system for providing reliable power to a redundant array of data storage units. The system includes one power supply module for each channel of the array of data storage units. A power supply failure will not impact the ability of the data storage system to recover data due to the ability of the data storage system to reconstruct data in an unavailable channel from the data storage units of each other channel. The use of independent power supplies provides a power supply system which has a power capability equal to the sum of the power requirements of the data storage units, and voltage outputs just sufficient to meet the voltage requirements of the data storage units.

13 Claims, 5 Drawing Sheets

FAULT TOLERANT POWER SUPPLY FOR AN ARRAY OF STORAGE DEVICES

BACKGROUND OF THE INVENTION

1. Field of the Invention

This invention relates to fault tolerant power supplies and more particularly to fault tolerant power supplies for supplying electrical power to a redundant array of data storage units.

2. Description of Related Art

A typical data processing system generally includes one or more storage units connected to a Central Processor Unit (CPU) either directly or through a control unit. The storage units store data and programs which the CPU uses in performing particular data processing tasks.

Various types of storage units are used in current data processing systems. A typical system may include one or more large capacity tape units and/or disk drives (magnetic, optical, or semiconductor) connected to the system through respective control units for storing data. In such systems, a problem exists if one of the large capacity storage units fails such that information contained in that unit is no longer available to the system. Often, such a failure will shut down the entire computer system. Such a failure may arise from a defect in the storage unit, or from a fault in the power supply for the storage unit. Therefore, among other things, it is critical for the power supply for such data storage units to be fault tolerant. It is also critical to be able to recover the data stored in a data storage unit if the storage unit fails for any reason, including loss of power.

The prior art has suggested several ways of solving the problem of providing reliable data storage. In systems where records are relatively small, it is possible to use error correcting codes which generate error correction code (ECC) syndrome bits that are appended to each data record within a storage unit. With such codes, it is possible to correct a small amount of data that may be read erroneously. However, such codes are generally not suitable for correcting or recreating long records which are in error, and provide no remedy at all if a complete storage unit fails. Therefore, a need exists for providing data reliability external to individual storage units.

A number of approaches to such "external" reliability have been described in the art. A research group at the University of California, Berkeley, in a paper entitled "A Case for Redundant Arrays of Inexpensive Disks (RAID)", Patterson, et al., *Proc. ACM SIGMOD*, June 1988, has catalogued five different approaches for providing such reliability when using disk drives as failure-independent storage units. Arrays of disk drives are characterized in one of five architectures, under the acronym "RAID" (for Redundant Arrays of Inexpensive Disks).

A RAID 1 architecture involves providing a duplicate set of "mirror" storage units and keeping a duplicate copy of all data on each pair of storage units.

A RAID 2 architecture stores each bit of each word of data, plus Error Detection and Correction (EDC) bits for each word, on separate disk drives. For example, U.S. Pat. No. 4,722,085 to Flora et al. discloses a disk drive memory using a plurality of relatively small, independently operating disk subsystems to function as a large, high capacity disk drive having an unusually high fault tolerance and a very high data transfer bandwidth. A data organizer adds 7 error detection and correction bits (determined using the well-known Hamming code) to each 32-bit data word to provide error detection and error correction capability. The resultant 39-bit word is Written, one bit per disk drive, on to 39 disk drives.

A RAID 3 architecture is based on the concept that each disk drive storage unit has internal means for detecting a fault or data error. Therefore, it is not necessary to store extra information to detect the location of an error; a simpler form of parity-based error correction can thus be used. In this approach, the contents of all storage units subject to failure are "Exclusive OR'd" (XOR'd) to generate parity information. The resulting parity information is stored in a single redundant storage unit. If a storage unit fails, the data on that unit can be reconstructed onto a replacement storage unit by XOR'ing the data from the remaining storage units with the parity information.

A RAID 4 architecture uses the same parity error correction concept of the RAID 3 architecture, but improves on the performance of a RAID 3 system with respect to random reading of small flies by "uncoupling" the operation of the individual disk drive actuators, and reading and writing a larger minimum amount of data (typically, a disk sector) to each disk (this is also known as block striping). A further aspect of the RAID 4 architecture is that a single storage unit is designated as the parity unit.

A RAID 5 architecture uses the same parity error correction concept of the RAID 4 architecture and independent actuators, but improves on the writing performance of a RAID 4 system by distributing the data and parity information across all of the available disk drives.

All of the RAID architectures use multiple data storage units. As discussed above, in addition to ensuring that the failure of one of the data storage units will not cause a loss of stored data, supplying the power requirements for a plurality of storage units is critical to proper operation of the data processing system. In many data processing systems, the supply of reliable power to the data storage units is ensured by use of redundant power supplies, each of which is capable of supplying the electrical power requirements of all the data storage units.

FIG. 1 and FIG. 1A illustrate such a prior art means for supplying power to an array of storage units. Dual power supplies 1 are summed together by summing circuit 6. Summing circuit 6 includes blocking diodes 2 that allow electrical current to flow in only one direction and a voltage regulator circuit 4. Blocking diodes are necessary to ensure isolation of the two power supplies during normal operation as well as during a failure condition. The blocking diodes would ensure that current from one power supply does not enter the other. Such a condition would occur if the voltage of each power supply were not perfectly identical (a feat that is hard to achieve in practice over a broad range of operating conditions). If there is a power supply failure, such as a short circuit in a part of the power supply distribution circuitry on the anode side of the blocking diodes, none of the storage devices would be effected due to the isolation provided by the blocking diodes. The storage devices would be supplied current by the operational power supply due to the reverse bias condition applied to the blocking diode connected to the malfunctioning power supply. Each power supply 1 is designed such that it has the capability of providing the total required current at the proper voltage for an entire array of storage units 3. Typically, the power supplies 1 will also be responsible for supplying power to array controllers 11 that control the transfer of data between a CPU and each storage unit 3 of the array.

A disadvantage that arises from use of this method of providing power to the array of storage units is that the combined potential power output when both power supplies are functional is twice as great as required to meet both power requirements of the array, since each power supply must be capable of independently supplying all of the required power if the other supply fails. That is, if there are N storage units in an array, each requiring W watts, each power supply must be capable of supplying $N \times W$ watts. Hence, the total capacity of the power supplies must be $2 \times N \times W$ watts. This excess potential is expensive and inefficient.

Furthermore, it is generally essential for the voltage supplied to the data storage units to remain constant. Since the voltage drop of the blocking diodes 2 varies as a function of the current through each diode, and the current requirements of each data storage unit 3 vary as a function of time, the voltage supplied to each storage unit 3 will vary as a function of time unless regulated.

One voltage regulator 4 dedicated to each storage unit 3 is provided to ensure that the proper voltage is maintained at each storage unit 3 (See FIG. 1A). Because voltage regulation circuits generally require a voltage higher than the stable output desired, each redundant power supply must provide a voltage level higher than the voltage level that would be required if local voltage regulation were not needed. Therefore, the redundant power supplies must be larger than would be necessary in the absence of such local voltage regulators within each storage unit. Additionally, each regulation circuit will add to the overall cost of the system.

Alternatively, a sensing circuit that dynamically determines the amount of voltage lost due to the diodes may be used to provide feedback to an active voltage regulator circuit that adjusts the power supply output voltage to compensate for these losses. Such circuits are known. The obvious disadvantage to this approach is the need for additional circuitry.

Therefore, it is desirable to create a fault tolerant power supply system that has a power capability that need not be greater than the electrical power required by the sum of all the storage units during normal operation, and which has a voltage output just sufficient to meet the voltage requirements of the data storage units.

SUMMARY OF THE INVENTION

The present invention is a fault tolerant power supply system for providing reliable power to a redundant array of data storage units. The system includes one power supply module for each channel of an array of data storage units.

The inventive fault tolerant power supply system is part of a data storage system in which the data storage units of a redundant array are arranged in channels. Each channel includes at least one data storage unit connected by an I/O bus to at least one controller. In the preferred embodiment, the data storage units are arranged in fault tolerant RAID (Redundant Arrays of Inexpensive Disks) redundancy groups which include no more than one data storage device from each channel. The present invention can include one or more such RAID redundancy groups. Each power supply within the fault tolerant power supply system is dedicated to one channel of data storage units and is capable of supplying the maximum power requirements of the sum of the storage units of that channel.

If a power supply fails, power will not be supplied to the storage units of the channel to which the failed power supply is dedicated. However, the power supply failure will not impact the ability of the data storage array to recover data, due to the ability of the RAID data storage array to reconstruct the data from the data storage units of the other channels.

The use of independent power supplies, each dedicated to one channel of the data storage array, provides a power supply system for a redundant array data storage system which has a power capability that does not have to exceed the sum of the power requirements of the data storage units. Use of independent power supplies also makes it possible to have power supplies in which the voltage outputs are just sufficient to meet the voltage requirements of the data storage units. No blocking diode or additional voltage regulation circuitry is required at the data storage device to achieve fault tolerance.

The details of the preferred embodiment of the present invention are set forth in the accompanying drawings and the description below. Once the details of the invention are known, numerous additional innovations and changes will become obvious to one skilled in the art.

BRIEF DESCRIPTION OF THE DRAWINGS

Like reference numbers and designations in the various drawings refer to like elements.

DETAILED DESCRIPTION OF THE INVENTION

Throughout this description, the preferred embodiment and examples shown should be considered as exemplars, rather than as limitations on the present invention.

Figure 1:
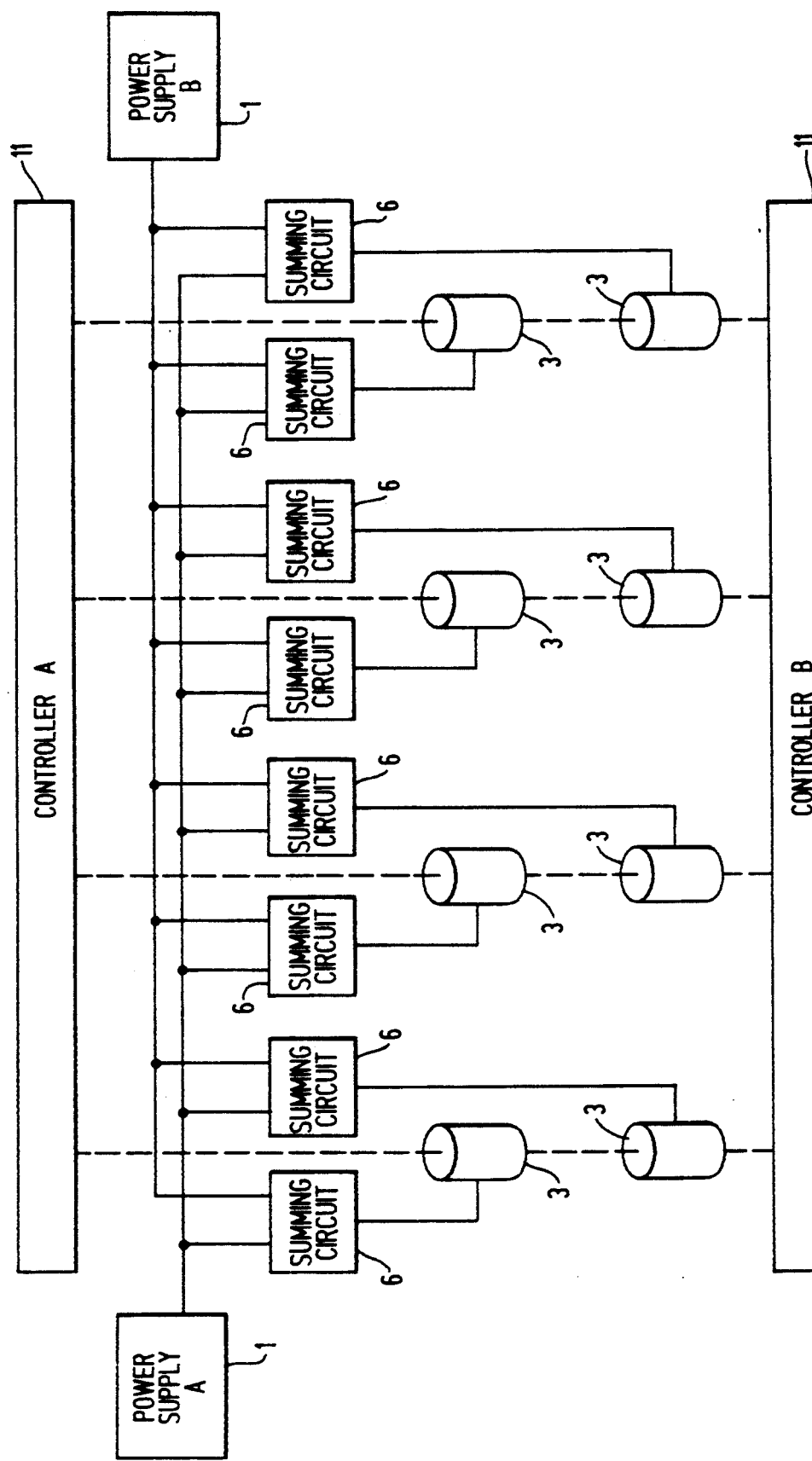
FIG. 1 is a simplified schematic of a prior art power supply system coupled to a redundant array of data storage units.
Figure 1A:
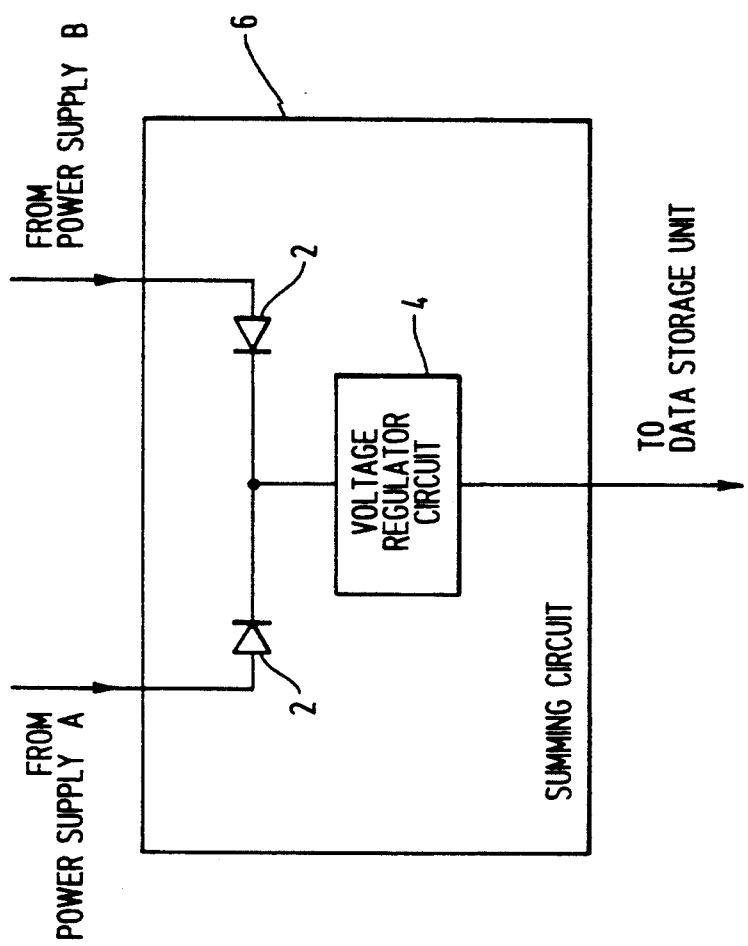
FIG. 1A is a simplified schematic of a prior art pair of blocking diodes and a voltage regulator.
Figure 2:
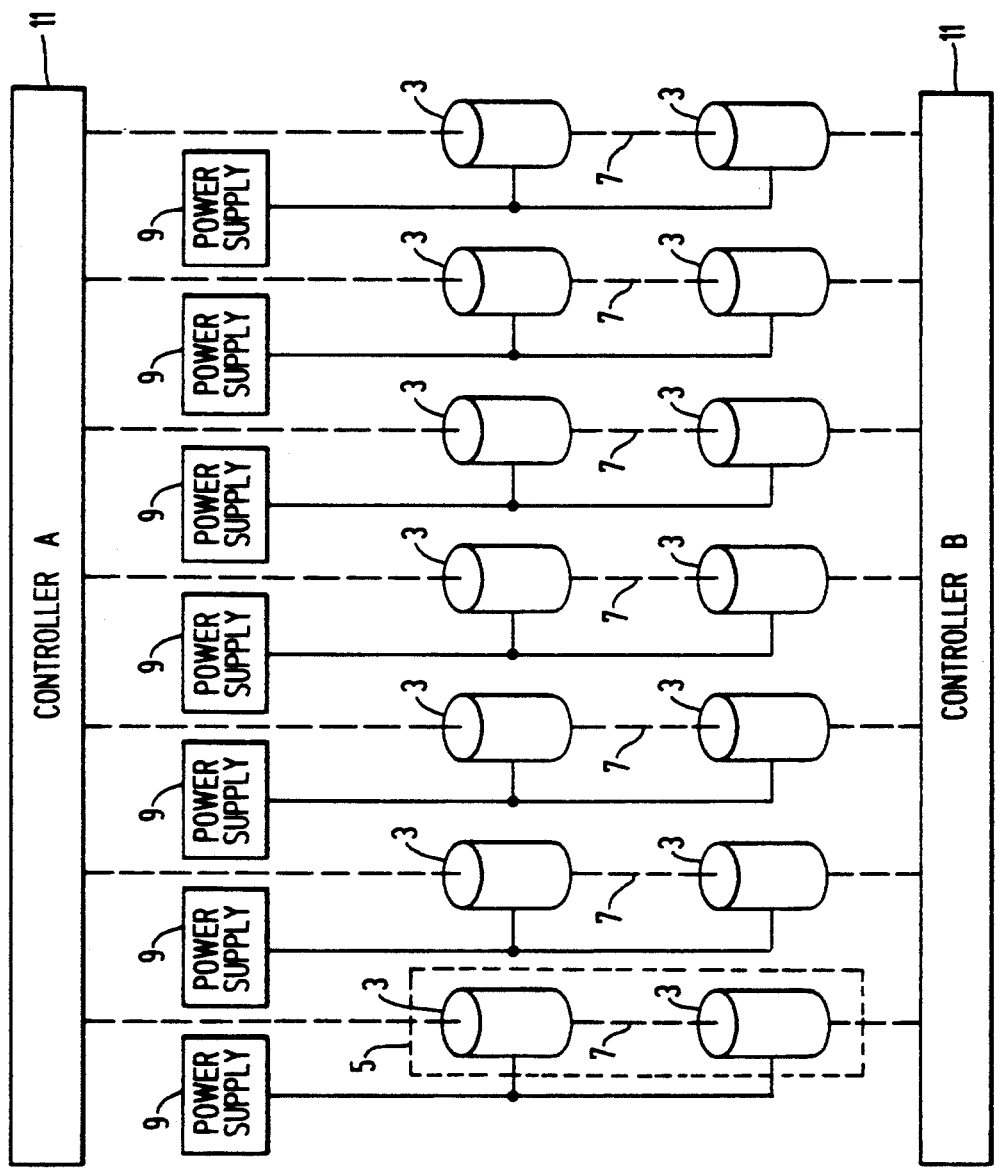
FIG. 2 is a simplified schematic of the preferred embodiment of the inventive power supply system coupled to a redundant array of data storage units.

Referring to FIG. 2, the inventive power supply system is shown used in a data storage system including an array of data storage units. Channels of data storage units 3 are shown coupled by broken vertical lines representing I/O buses 7 (such as Small Computer System Interface Buses or SCSI Buses). A channel 5 of data storage units 3 is defined as all data storage units 3 in the array coupled by one I/O bus 7. Each channel 5 is connected to at least one data controller 11 that controls Read and Write operations which transfer data to and from the data storage units 3. The array of data storage units 3 shown can function as a RAID 1, RAID 2, RAID 3, RAID 4, or RAID 5 system. In any case, the data stored is recoverable upon a failure of any number of data storage units 3 of any one channel 5 using known RAID recovery techniques.

A single power supply 9 is coupled to each channel 5 of data storage units 3 and supplies the power requirements of that channel 5. Each power supply 9 has a maximum power output rating at least equal to the maximum power requirement of the sum of the data storage units 3 in the corresponding channel 5.

The data stored in the data storage units 3 of a single channel 5 can be recovered upon failure of the entire channel 5, using known RAID recovery techniques. Thus, failure of any one power supply 9 will not cause data to become unavailable to a requesting device, such as a controller 11, even though the entire corresponding channel 5 of data storage units 3 will become inoperable upon such a failure.

By having one independent power supply 9 responsible for supplying the power requirements of a corresponding channel 5 of data storage units 3, the total power supply capacity for the array is N×W, where W=the maximum power required by each data storage unit, and N=the number of data storage units in the array. This is one-half of the total power supply capacity of the prior art approach, where each of the redundant power supplies must be capable of supplying the power load of all the data storage units of the entire array upon a failure of the other power supply.

Additionally, it should be noted that no blocking diodes are required in the present inventive power supply system. Therefore, each power supply 9 can be designed for a voltage output equal to the voltage input requirement of the data storage units 3 in the channel 5 corresponding to that power supply 9.

Figure 3:
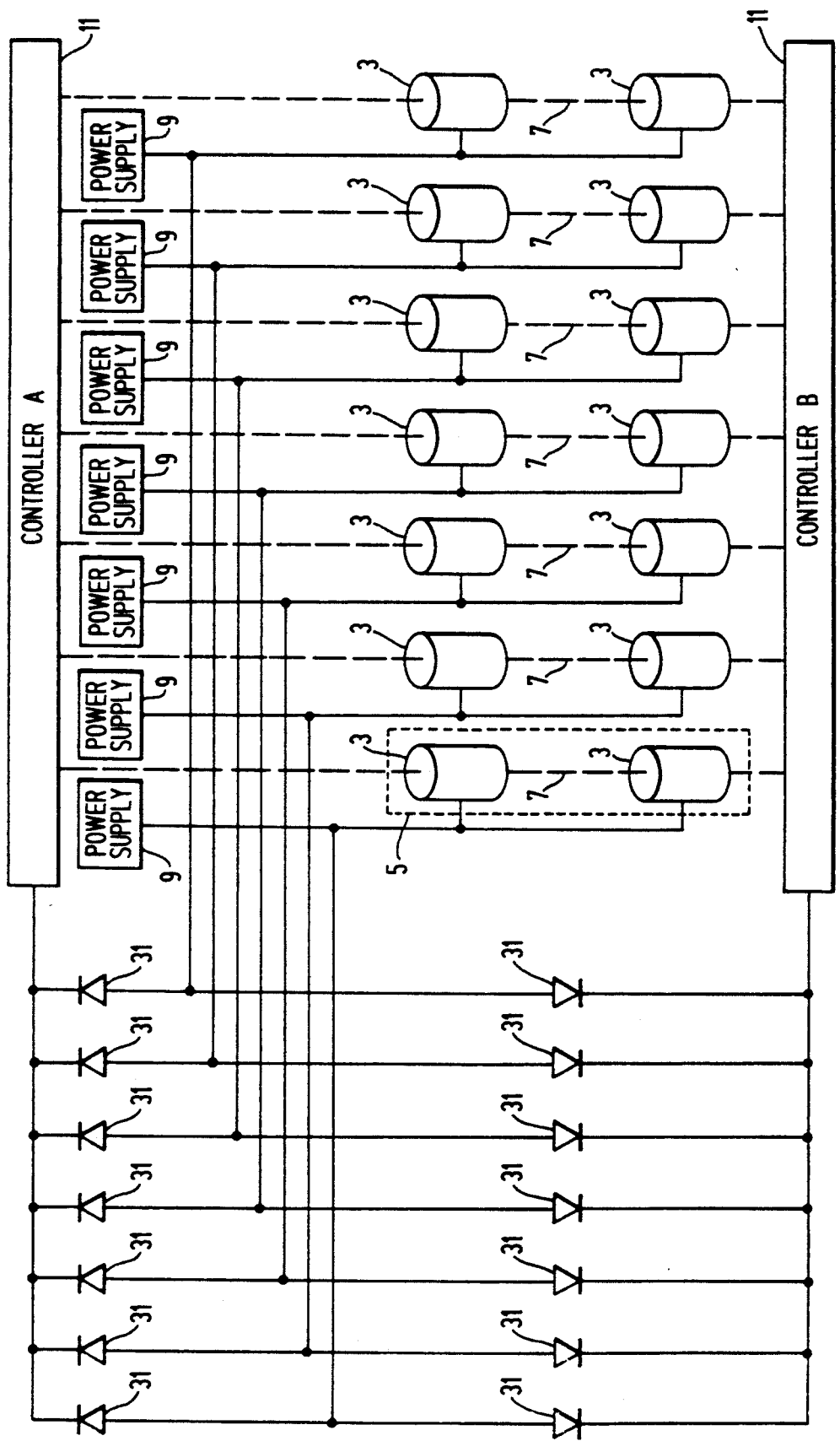
FIG. 3 is a simplified schematic of an alternative embodiment of the inventive power supply system coupled to a redundant array of data storage units, in which the sum of the outputs of the power supplies is coupled to redundant controllers.

In an alternative embodiment, the power supplies 9 can each be summed to provide the power requirements of the two controllers 11. FIG. 3 illustrates such an embodiment of the present invention. Blocking diodes 31 sum the currents of two or more of the power supplies 9 together. This requires a voltage regulator to ensure the proper voltage level over varying current conditions. While this arrangement will require that the voltage drop of the diodes 31 be taken into account, the benefit of summing the power supplies 9 is that the total power capacity need only increase proportionate to the number of power supplies 9 and the power required by the controller 11. (Note that the required total increase in rating for all power supplies 9 is the reciprocal of the number of power supplies, times the total power requirement of the controllers 11).

Figure 4:
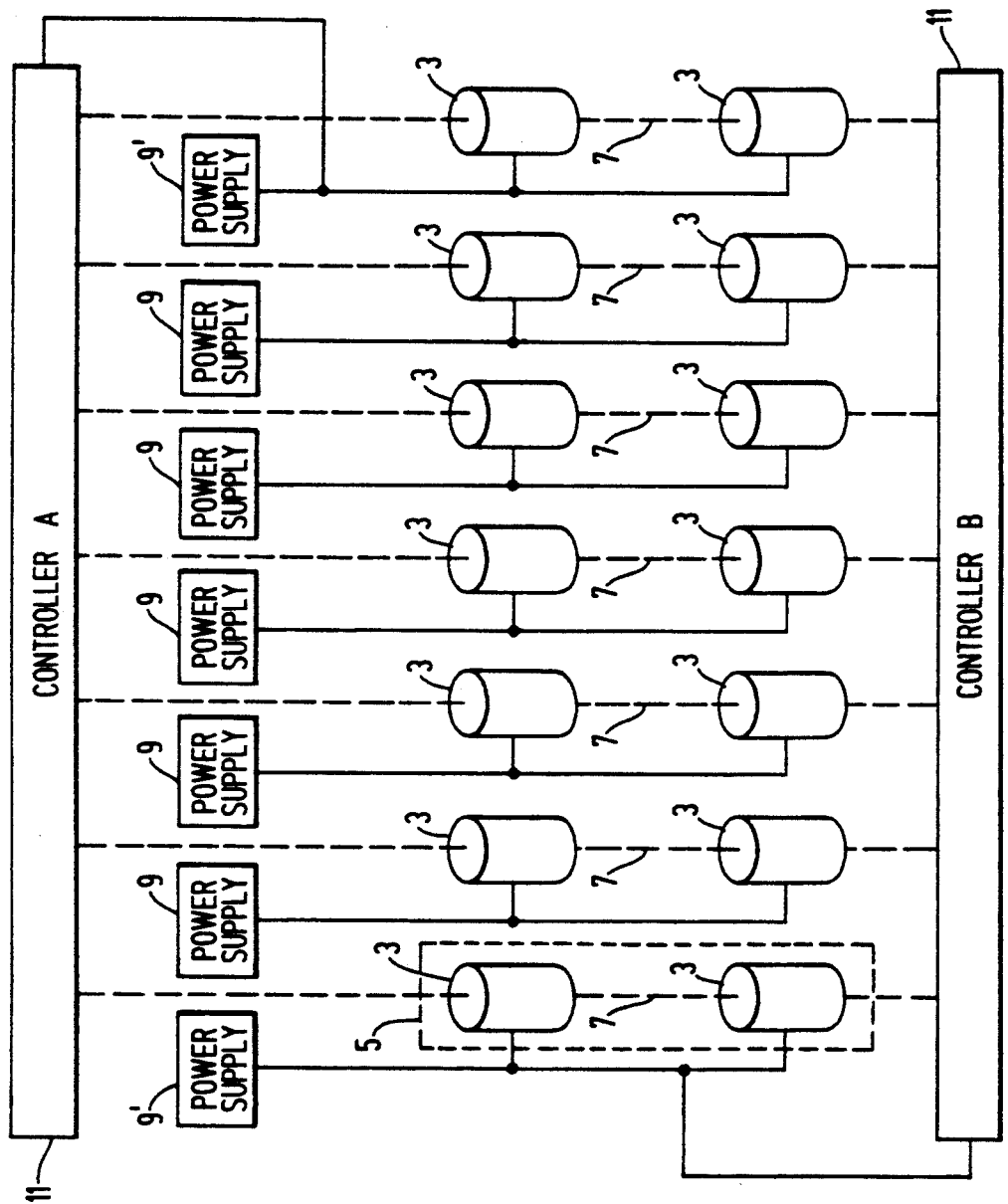
FIG. 4 is a simplified schematic of an alternative embodiment of the inventive power supply system coupled to a redundant array of data storage units, in which each controller is coupled to a separate one of the available power supplies.

In another alternative embodiment illustrated in FIG. 4, each controller 11 is coupled to only one of the power supplies 9. Therefore, each power supply 9' coupled to a controller 11 must be capable of supplying the total power requirement of all the data storage units 3 in the corresponding channel 5, plus the power requirements for the corresponding controller 11. However, the advantages of this embodiment is that there is no need for blocking diodes. Therefore, the voltage output of the selected power supply 9' need not be higher than the voltage input requirement of the attached controller 11 and data storage units 3.

Accordingly, since a failure of any one channel of storage units in a RAID system (whether the data storage units are configured in a RAID 1, RAID 2, RAID 3, RAID 4, or RAID 5 configuration) can be tolerated without any loss of data, the modular architecture of the inventive power supply system makes it unnecessary for the power supply system capability to exceed the power requirements of the components to which power is supplied. Also the modulator architecture eliminates the need for blocking diodes. Therefore, it is unnecessary for the power supply output voltage to exceed the voltage requirements of the components to which power is supplied.

A number of embodiments of the present invention have been described. Nevertheless, it will be understood that various modifications may be made without departing from the spirit and scope of the invention. Accordingly, it is to be understood that the invention is not to be limited by the specific illustrated embodiment, but only by the scope of the appended claims.

I claim:

1. A fault-tolerant power supply system for providing reliable power to a data storage array, including:
   (1) a redundant array of failure-independent data storage units, arranged in a plurality of channels;
   (2) a plurality of independent power supplies, each coupled to each data storage unit of a corresponding one of the channels of the redundant array; and
   (3) at least two redundant controllers, coupled to the data storage units, for controlling Read and Write operations to the data storage units;

wherein the outputs of the independent power supplies are summed together, and the summed output is coupled to each redundant controller.

2. A fault-tolerant power supply system for providing reliable power to a data storage array, including:
   (1) a redundant array of failure-independent data storage units, arranged in a plurality of channels;
   (2) a plurality of independent power supplies, each coupled to each data storage unit of a corresponding one of the channels of the redundant array; and
   (3) at least two redundant controllers, each coupled to all of the data storage units, for controlling Read and Write operations to the data storage units;

wherein each controller is coupled to a separate one of said independent power supplies.

3. The fault-tolerant power supply system of claims 1 or 2, wherein the redundant array of failure independent data storage units are arranged as a RAID 1 system, such that for each data storage unit present in the redundant array having a set of stored data, there is one corresponding data storage unit having stored data, the stored data of each data storage unit being identical to the stored data of the corresponding data storage unit.

4. The fault-tolerant power supply system of claims 1 or 2, wherein the redundant array of failure independent data storage units are arranged as at least one fault tolerant RAID redundancy group, each redundancy group including at least two data storage units each from a distinct channel, each of such data storage units storing data which can be used to reconstruct data stored in any one data storage unit within the corresponding redundancy group.

5. The fault-tolerant power supply system of claims 1 or 2, wherein the redundant array of failure independent data storage units are arranged as a RAID 1 system.

6. The fault-tolerant power supply system of claims 1 or 2, wherein the redundant array of failure independent data storage units are arranged as a RAID 2 system.

7. The fault-tolerant power supply system of claims 1 or 2, wherein the redundant array of failure independent data storage units are arranged as a RAID 3 system.

8. The fault-tolerant power supply system of claims 1 or 2, wherein the redundant array of failure independent data storage units are arranged as a RAID 4 system.

9. The fault-tolerant power supply system of claims 1 or 2, wherein the redundant array of failure independent data storage units are arranged as a RAID 5 system.

10. The fault-tolerant power supply system of claims 1 or 2, wherein the voltage of each power supply is substantially equal to the voltage required by each of the coupled data storage units.

11. The fault-tolerant power supply system of claims 10, wherein the independent power supplies have a combined power output capability that is substantially equal to the combined maximum power requirements of all the coupled data storage units.

12. The fault-tolerant power supply system of claims 1 or 2, wherein the independent power supplies have a combined power output capability that is substantially equal to the combined maximum power requirements of all the coupled data storage units.

13. The fault-tolerant power supply system of claim 12, wherein the voltage of each power supply is substantially equal to the voltage required by each of the coupled data storage units.

* * * * *